(12) United States Patent
Barr et al.

(10) Patent No.: US 8,340,307 B2
(45) Date of Patent: *Dec. 25, 2012

(54) PASSIVE SOUND PRESSURE LEVEL LIMITER

(75) Inventors: Joshua James Barr, Bangor, MI (US); Medford Alan Dyer, San Diego, CA (US); Alan Dean Michel, Fishers, IN (US); Christopher Todd Welsh, Fishers, IN (US)

(73) Assignee: Harman International Industries, Inc., Stamford, CT (US)

( * ) Notice: Subject to any disclaimer, the term of this patent is extended or adjusted under 35 U.S.C. 154(b) by 766 days.

This patent is subject to a terminal disclaimer.

(21) Appl. No.: 12/583,139

(22) Filed: Aug. 13, 2009

(65) Prior Publication Data

US 2011/0038491 A1 Feb. 17, 2011

(51) Int. Cl.
*H03G 11/00* (2006.01)

(52) U.S. Cl. ............... 381/55; 381/56; 381/72

(58) Field of Classification Search ............ 381/55–58, 381/72, 74, 71.4, 17, 150, 117, 346, 107, 381/349, 337, 163; 181/129, 157, 163, 175, 181/139

See application file for complete search history.

(56) References Cited

U.S. PATENT DOCUMENTS

| | | | | |
|---|---|---|---|---|
| 3,869,699 | A * | 3/1975 | Haller et al. | 367/197 |
| 6,408,069 | B1 * | 6/2002 | Furlong | 379/394 |
| 2006/0262938 | A1 * | 11/2006 | Gauger et al. | 381/56 |
| 2007/0230715 | A1 | 10/2007 | Ingemi et al. | |
| 2008/0175397 | A1 * | 7/2008 | Holman | 381/55 |

OTHER PUBLICATIONS

NJRC's Audio IC Line-up, featuring the NJM2761, NJR News, vol. 44, Nov. 30, 2004, p. 1 http://www.njr.com/index4.html.
Audio Limiter NJM2761 data sheet, NJR Corporation, pp. 1-8 (listed under Product Information/Audio/Audio(Others) http://www.njr.com/index4.html.

* cited by examiner

*Primary Examiner* — Vivian Chin
*Assistant Examiner* — Friedrich W Fahnert
(74) *Attorney, Agent, or Firm* — Patent Law Office of David G. Beck

(57) ABSTRACT

A passive sound pressure level (SPL) limiter is provided that can be used with audio sources of varying drive levels and headsets, earbuds, etc. of varying sensitivity. The SPL limiter includes a control circuit that includes a rectifier and, in most configurations, a step-up transformer. The SPL limiter also includes a limiting circuit that utilizes a transistor to shunt current from the audio source in proportion to a control signal output by the control circuit. The control circuit may further include a low pass filter, for example an RC filter, and one or more fast limit diode paths. The limiting circuit may further include a feedback network to increase the linear behavior of the limiting circuit.

24 Claims, 12 Drawing Sheets

PASSIVE SOUND PRESSURE LEVEL LIMITER

FIELD OF THE INVENTION

The present invention relates generally to audio systems and, more particularly, to means for limiting the sound pressure level.

BACKGROUND OF THE INVENTION

A large percentage of the population is affected by hearing loss or impairment. For example, the National Institute on Deafness and Other Communication Disorders estimates that in the United States, 17 percent or approximately 36 million adults have some degree of hearing loss. While there is a strong correlation between age and hearing loss, a surprising study by the American Medical Association reported that approximately 15 percent of school-aged children have a hearing loss. Additionally, it has been reported that hearing problems are on the increase in all age groups.

The primary causes of hearing loss are heredity, aging, disease, trauma, ototoxic medication and long-term exposure to loud noises. Given that our day-to-day environment has become noisier in recent times, both in terms of the noise levels experienced at work and in our leisure time, undoubtedly noise induced hearing loss is the main reason that hearing problems are on the rise. Additionally, given that noise induced hearing loss is the result of both the sound pressure level (SPL) and the length of exposure, the routine and in some cases almost constant use of headphones and earbuds is certainly a contributing factor to the noted increase, especially in younger age groups.

By their very design, headphones and earbuds place the speaker transducers in close proximity to the user's eardrums. While this configuration may be convenient and, in some cases, provide an excellent listening experience, if the volume levels are set too high, their use can easily lead to hearing loss. Unfortunately, recent studies have shown that between 25 and 50 percent of headphone/earbud users routinely listen at volume levels high enough to cause hearing loss. Further exacerbating this problem is the fact that most users will turn up the volume level in an attempt to drown out background noise (e.g., commuting noise, co-workers, etc.).

In addition to educating people on the pitfalls of excessive volume levels, a number of products have recently come to market that attempt to control the SPL delivered through a headset. Setting the maximum SPL to an acceptable level is difficult, however, since different headphones/earbuds exhibit different sensitivities, and thus deliver different sound pressure levels for the same drive level.

One approach to limiting the SPL is to place a resistor between the headphone/earbud and the audio source. The resistor reduces the current to the headphone/earbud, thereby limiting the generated SPL. Unfortunately, in order to set the SPL to a specific, desired level, the maximum drive level from the audio source as well as the sensitivity of the headphone/earbud must be known. Therefore, this approach would require selecting a specific resistor for each source/earpiece combination.

Another often-used approach for liming the SPL is to limit the maximum output volume, i.e., drive voltage, from the audio source. This feature is included in many MP3 and Apple music players. This approach will only work, however, if the sensitivity of the headphone/earbud is known in advance of setting the maximum sound level. Otherwise, changing the headphone/earbud from a low sensitivity earpiece to a high sensitivity earpiece without changing the maximum output level will allow the desired SPL to be exceeded. Conversely, changing the headphone/earbud from a high sensitivity earpiece to a low sensitivity earpiece may yield unacceptably low volume levels.

Yet another approach to limiting the SPL is to use a limiting circuit based on a combination of resistors and diodes. As this approach is typically only used when the sensitivity of the headphone/earbud is known, the limiting circuit may be permanently coupled to the earpiece, for example by molding the limiting circuit into the earpiece cabling. In addition to only working with a specific headset, most users find this approach unsatisfactory due to the very noticeable distortion at high SPL levels that result from the nonlinear characteristics of the diode.

While a number of approaches are currently being used to limit the sound pressure levels of headphones and earbuds, and thus prevent potential hearing damage, these approaches tend to have limited applicability due to their inability to take into account variations in source drive levels and earpiece sensitivities. Additionally, these approaches often create unacceptable levels of distortion, thus further reducing the number of people willing to use them. Accordingly, what is needed is a non-distorting SPL limiter design that can be applied to a wide range of source/earpiece combinations. The present invention provides such a limiter design.

SUMMARY OF THE INVENTION

The present invention provides a passive sound pressure level (SPL) limiter for use with an audio source and an earpiece, the SPL limiter comprised of a control circuit that includes a rectifier, and a limiting circuit that reduces power from the audio source to the earpiece in proportion to a control signal output by the control circuit. Preferably the limiting circuit includes a transistor. In one configuration, the transistor (e.g., an enhancement-mode, n-channel MOSFET) shunts current from the audio source in proportion to a control signal output by the control circuit. In another configuration, the transistor (e.g., a depletion-mode, n-channel MOSFET) limits voltage from the audio source in proportion to a control signal output by the control circuit. The control circuit may include a transformer, for example a transformer with a turns ratio of between 1:10 and 1:50. The rectifier circuit may be a full wave rectifier comprised of four Schottky diodes. Alternately, the rectifier circuit may be comprised of a voltage multiplier. The control circuit may further comprise a filter circuit, for example a low pass filter such as an RC filter. The control circuit may further comprise one or more fast limit diode paths, each such fast limit diode path being comprised of one or more diodes. One or more than one of the fast limit diode paths may also comprise a current limiting resistor. The limiting circuit may further comprise a feedback network, for example comprised of a pair of resistors, to increase the linear behavior of the limiting circuit. The passive SPL limiter may further comprise a pair of pad resistors interposed between the audio source and the earpiece. The passive SPL limiter may further comprise a frequency-weighting filter, for example interposed between the audio source and the control circuit. The passive SPL limiter may further comprise an oscillator circuit interposed between the control circuit and the limiting circuit, the oscillator circuit comprising a voltage reference source, a charging capacitor connected to the control circuit via a resistor, a comparator that outputs a first signal when the output from the charging capacitor is greater than the reference voltage and outputs a second signal when the output from the charging capacitor is less than the reference voltage, means (e.g., a CMOS pair) to discharge the charging capacitor to ground, and an oscillator for controlling when the charging capacitor is discharged to ground. The passive SPL limiter may further comprise a second limiting circuit electrically connected to the control circuit output, the second limiting circuit shunting current from the audio source in proportion to the control signal in order to limit the audio signal from a second channel of the audio source to a second earpiece. In the configuration using a second limiting circuit, the control circuit may receive a second output signal from the audio source, the second output signal corresponding to the second channel of the audio source.

A further understanding of the nature and advantages of the present invention may be realized by reference to the remaining portions of the specification and the drawings.

DESCRIPTION OF THE SPECIFIC EMBODIMENTS

In the following text, the terms "earpiece", "headphone", "headset", "in-ear monitor" and "earbud" may be used interchangeably and may refer to any of a variety of different drivers/speakers, for example those that fit over the ear (e.g., headphones) or within at least a portion of the ear (e.g., earbuds and in-ear monitors). Additionally, it should be understood that these terms may refer to drivers/speakers commonly associated with music players (e.g., earbuds), telephones (e.g., telephone handset, cell phone headset), computers (e.g., computer speakers), or other audio sources. Similarly, the terms "audio player", "audio source" and "source" may be used interchangeably and may refer to any of a variety of different audio sources, for example MP3 players, Apple iPods, CD and DVD players, stereo receivers, stereo amplifiers, headphone amplifiers, cell phones, telephones, and other sources of audio data suitable for transmission over an earpiece. It should be understood that identical element symbols used on multiple figures refer to the same component, or components of equal functionality. Additionally, the accompanying figures are only meant to illustrate, not limit, the scope of the invention and should not be considered to be to scale.

Figure 1:
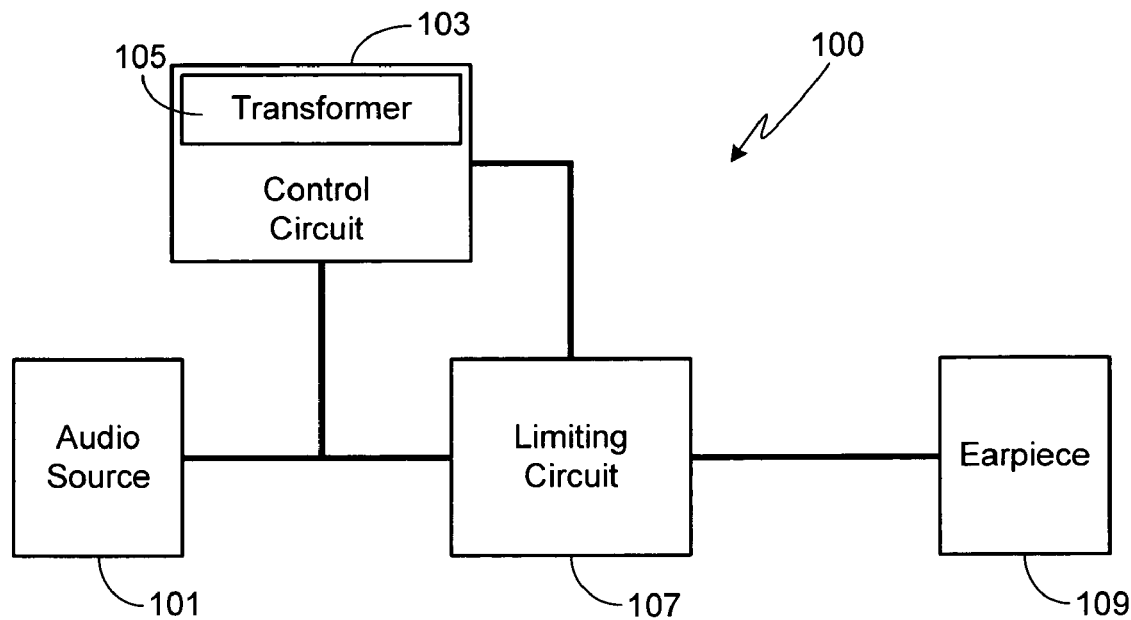
FIG. 1 provides a top-level view of an SPL limiter in accordance with the invention.

FIG. 1 illustrates the basic elements of a sound pressure level (SPL) limiter in accordance with the invention. SPL limiter 100 is passive, i.e., not powered by a battery or other external power supply. As shown, audio source 101 is coupled to a control circuit 103 that outputs a low frequency or DC control signal that represents the signal level from audio source 101. Preferably, and as described in detail below, control circuit 103 includes a transformer 105 to step-up the signal level from audio source 101. The control signal from control circuit 103 is used by limiting circuit 107 to limit the power, more specifically the voltage or current, passed through to earpiece 109, thereby limiting the maximum SPL of earpiece 109.

Figure 2:
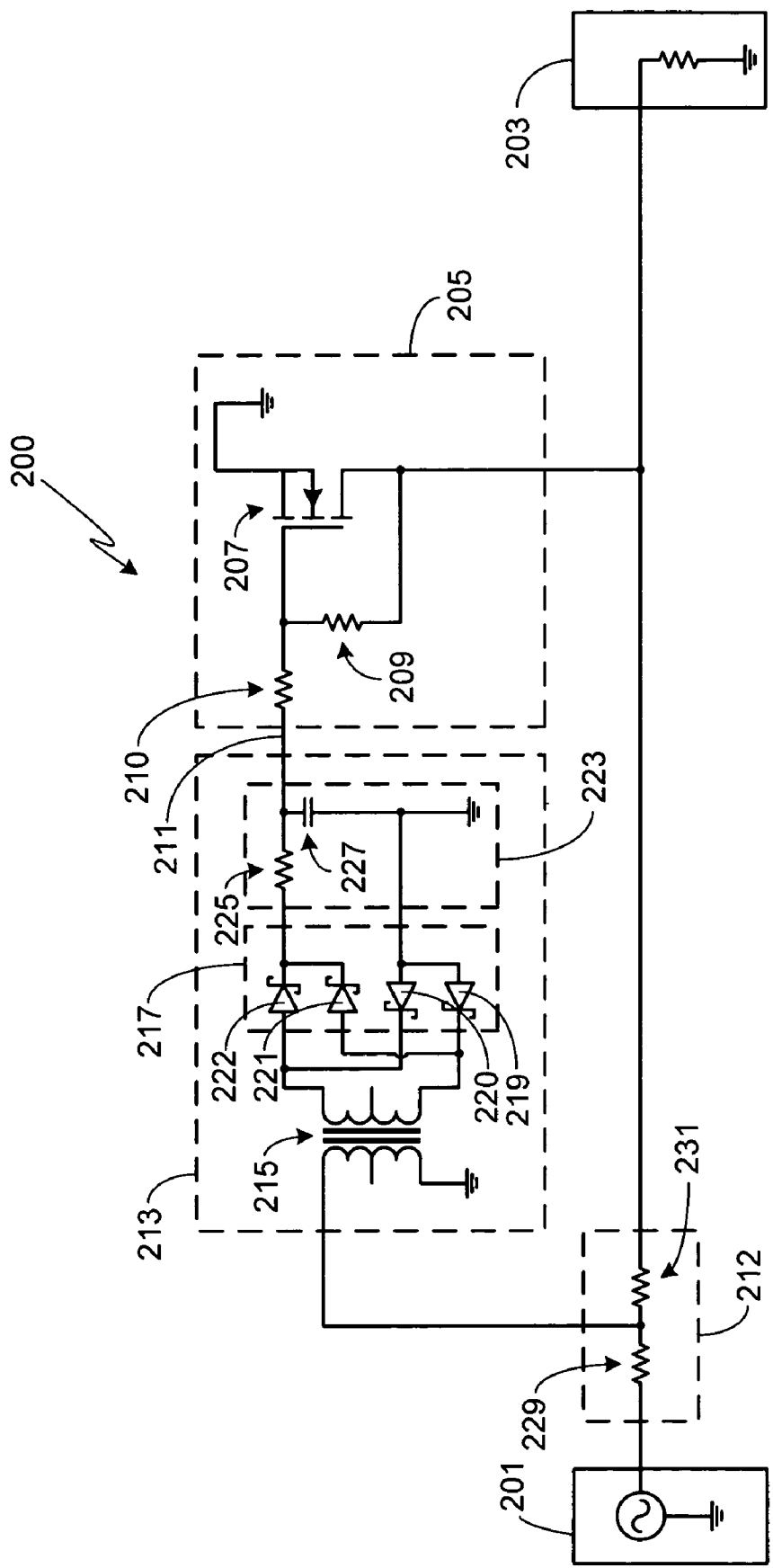
FIG. 2 provides a detailed diagram of a preferred embodiment.

FIG. 2 provides a detailed diagram of a preferred embodiment of the invention. It will be appreciated that while a single channel audio source 201 and a single earpiece 203 are shown for the sake of clarity, it is expected that most embodiments of the present invention would be configured for multi-channel, e.g., stereo, applications. In addition to simply duplicating the circuit and using one circuit per channel, other configurations are possible which would allow the SPL limiter of the present invention to be used for a multi-channel application. Some of these other configurations are described in further detail below. Additionally, it should be understood that the present invention may be implemented in a stand-alone device (e.g., separate from the audio source and earpiece, but intended for use with an audio source and earpiece), implemented within an audio source, or implemented within an earpiece (e.g., within a headset or headset cable).

Limiting circuit 205 of SPL limiter 200 is comprised of means to reduce the power delivered to earpiece 203 in proportion to the control signal output by the control circuit, for example by shunting current from audio source 201 using a transistor 207 or other means. Preferably, and as illustrated, transistor 207 is an enhancement-mode, n-channel MOSFET. In the illustrated embodiment, limiting circuit 205 also includes a feedback network comprised of resistors 209 and 210. In this embodiment, resistors 209/210 each have a value of 2.2 megohms. The control voltage on signal path 211 controls the amount of resistance in the channel of MOSFET 207. More specifically, as the control voltage on signal path 211 increases, the gate voltage increases and the resistance of the channel decreases. As the channel resistance decreases, more current flows through MOSFET 207, thereby causing a voltage drop across pad resistors 212 to increase. As a result, the voltage to earpiece 203 is decreased, causing a corresponding decrease in the SPL generated by earpiece 203.

The control voltage on signal path 211 is generated by control circuit 213. Control circuit 213 is comprised of a transformer, a diode rectifier and an RC filter. The function of transformer 215 is to step up, i.e., increase, the voltage generated by audio source 201. A typical turns ratio for transformer 215 is between 1:10 and 1:50, resulting in the voltage created on the secondary side of the transformer being between 10 and 50 times greater than the voltage on the primary, i.e., input, side. On the secondary side of transformer 215 is a voltage rectifier 217. In the preferred embodiment, rectifier 217 is a full wave rectifier implemented with four Schottky barrier diodes 219-222. Schottky diodes are preferred in this application in order to minimize the power loss, i.e., as compared to ordinary PN junction diodes. The low forward voltage drop of the Schottky diodes allows rectification to start at a lower voltage on the secondary. After the signal is rectified, it passes to RC filter 223, which is comprised of resistor 225 and capacitor 227. In this embodiment, resistor 225 has a value of 200 kohms and capacitor 227 has a value of 10 µf. RC filter 223 is a first order, low pass filter with a time constant on the order of seconds. The output of RC filter 223 is the control voltage on signal path 211. The DC value of the control voltage is approximately proportional to the magnitude of the AC signal between pad resistors 229 and 231. In the case where pad resistor 229 has a value of zero ohms, the control voltage is approximately proportional to the signal generated by audio source 201. As described above, the control voltage on signal path 211 controls limiting circuit 205, and thus the SPL generated by earpiece 203.

Pad resistors 229 and 231 effectively "pad" the audio signal, i.e., resist current flow between audio source 201 and earpiece 203, thereby reducing the SPL generated by the earpiece. A second function of the pad resistors is to provide a minimum resistance for audio source 201 to drive when the resistance of the FET channel in transistor 207 approaches zero. If the pad resistors were not in place, transistor 207 could effectively short audio source 201 to ground, creating a potentially large current flow that could damage both audio source 201 and transistor 207. Pad resistors 229 and 231 limit this current flow.

The ratio of resistor 229 to resistor 231 affects the performance of control circuit 213. When the value of resistor 229 is very low or zero, control circuit 213 is effectively driven by audio source 201. In this scenario, as the voltage generated by audio source 201 increases, the impedance of the FET channel in transistor 207 will decrease. Depending on the characteristics of transistor 207, this can lead to a situation where the SPL at earpiece 203 decreases as the output voltage of audio source 201 is increased.

If the ratio of resistor 229 to resistor 231 is reversed such that the value of resistor 229 is much greater than that of resistor 231, then control circuit 213 tends to be driven by the voltage at earpiece 203. In this scenario, once transistor 207 has started to shunt current, the amount of current that is shunted can only increase if the voltage at earpiece 203 increases. This creates a situation where the SPL at earpiece 203 increases with increasing audio source 201 output, albeit at a slower rate.

Between the extreme ratios of pad resistors 229 and 231 described above exists a point where the limiter is affected by both the voltage at audio source 201 and the voltage at earpiece 203. Under this scenario, a relatively flat response can be obtained so that as the output of audio source 201 is increased, the SPL generated by earpiece 203 stays at approximately the same level. In the illustrated embodiment, resistors 229/231 each have a value of 10 ohms.

Figure 3:
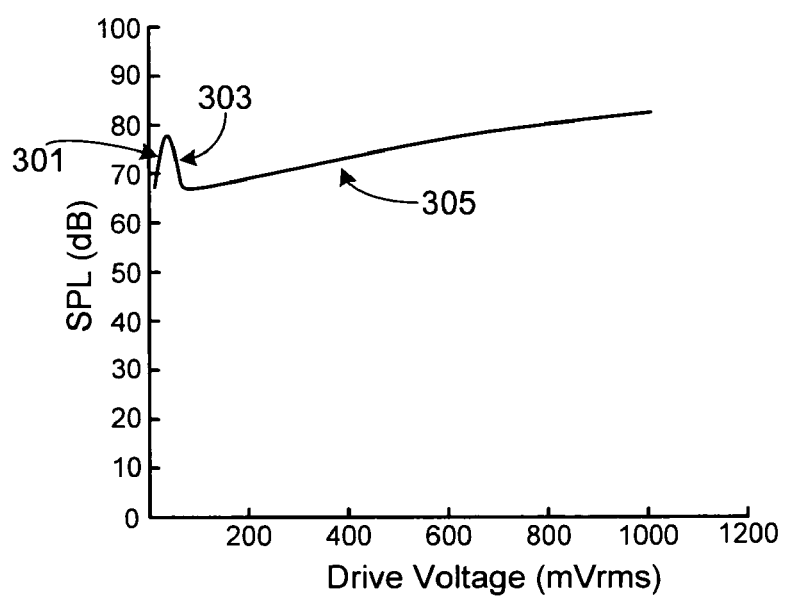
FIG. 3 is a graph illustrating the relationship between audio source voltage and SPL generated at the earpiece for a particular embodiment of the invention.

FIG. 3 is a graph illustrating the relationship between audio source voltage (i.e., X-axis in mVrms) and SPL (i.e., Y-axis in dB) generated at the earpiece for the embodiment illustrated above in which values for pad resistors 229 and 231 are 0 and 75 ohms, respectively. In region 301 of the plot, the control voltage is not large enough to allow limiting circuit 205 to shunt a significant amount of current. Near the end of region 301, FET 207 is starting to shunt current. Through all of region 303 the control voltage is increasing and FET 207 is shunting current at a rate faster than the rate at which audio source 201 is increasing its output current. The result is a lowering of the voltage at earpiece 203, and thus a decrease in SPL. In region 305, the SPL starts to increase again. This is the result of FET 207 reaching its minimum resistance. Once this point is reached, increases in control voltage do not affect the shunt current.

Figure 4:
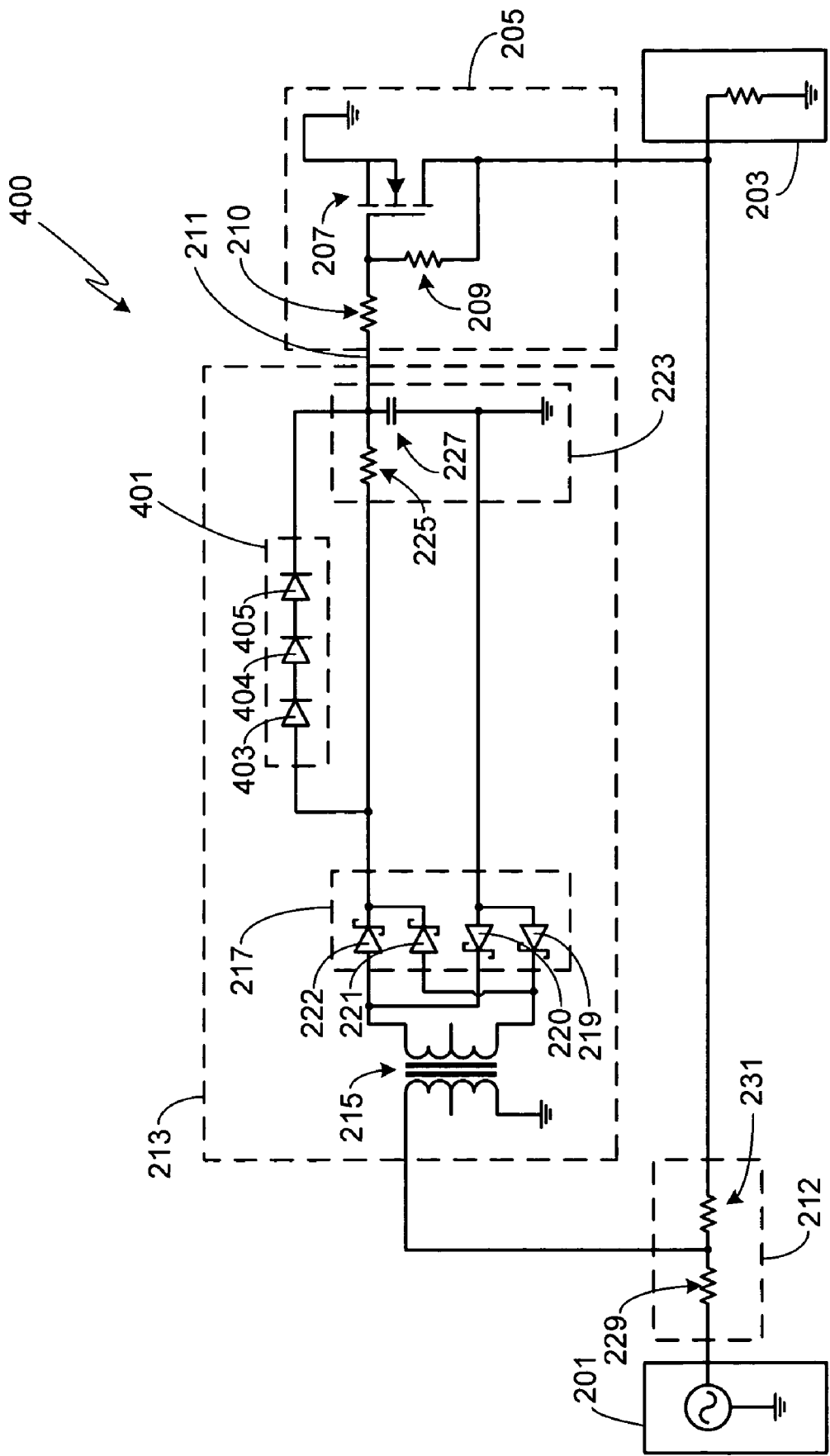
FIG. 4 illustrates a modification of the circuit shown in FIG. 2, the modified circuit including a series of fast limiting diodes.

The circuit shown in FIG. 2 achieves low distortion by not clipping large, short duration audio signals from source 201. FIG. 4 illustrates a modified circuit suitable for applications where it is desirable to have the limiting circuit respond faster to high level spikes in the audio signal. In particular, circuit 400 modifies the previous circuit by adding diodes in parallel to low pass filter resistor 225. In the illustrated circuit, a series of fast limit diodes 401, specifically diodes 403-405, will quickly suppress a loud spike in the audio signal. It should be understood that although the illustrated circuit shows three diodes 403-405, the circuit may use more or less diodes in this series, depending upon the level of input spike that is to be suppressed. The more diodes in this series, the larger the cumulative forward voltage drop must be before any current can flow through them to charge capacitor 227. Conversely, if three diodes, as shown, are limiting at too high a voltage level, then two diodes or even a single diode may be used. Additionally, a resistor may be added to the circuit (not shown), following the fast limiting diodes, thereby limiting the rate at which the spike is allowed to charge capacitor 227 and thus increase the control voltage.

Figure 5:
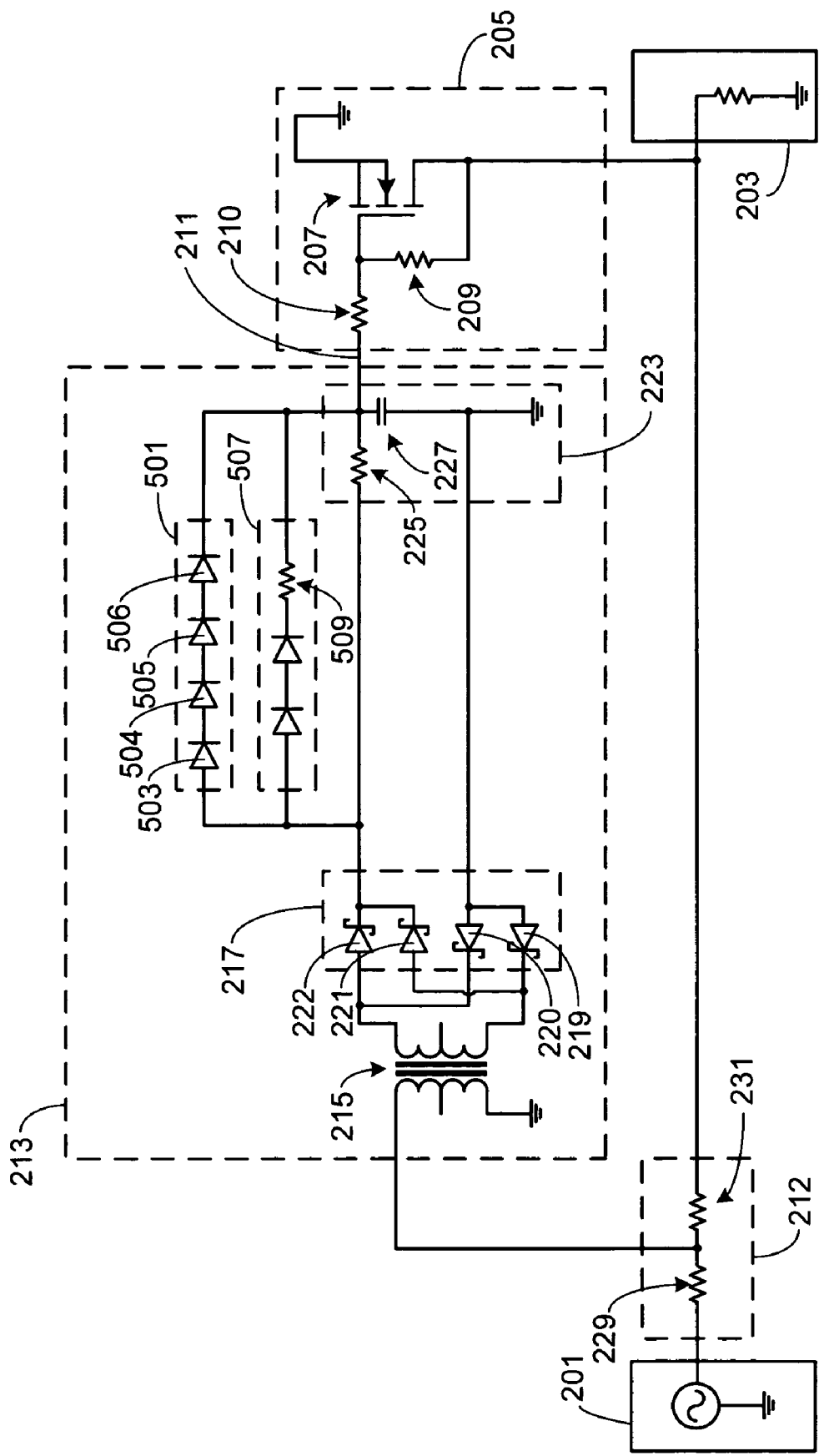
FIG. 5 illustrates a modification of the circuit shown in FIG. 2, the modified circuit including multiple series of fast limiting diodes to control different spike levels.

In a modification of the circuit shown above, multiple parallel paths of diodes and resistors can be implemented to allow different charge rates depending on the level of the spike in the audio signal. In the modified circuit shown in FIG. 5, only the highest level signals can pass current through path 501. This is because the signal must be larger than the combined forward drops of diodes 503-506 plus the control voltage. There is no current limiting resistor in this path so the limit is basically the output impedance of the secondary of transformer 215. As a consequence, when current flows through path 501, capacitor 227 is immediately charged. Smaller audio signal spikes can pass through path 507. This path is limited by resistor 509, with a nominal resistance of 50 kohms, and will charge capacitor 227 four times as fast as resistor 225, which has a nominal resistance of 200 kohms.

Figure 6:
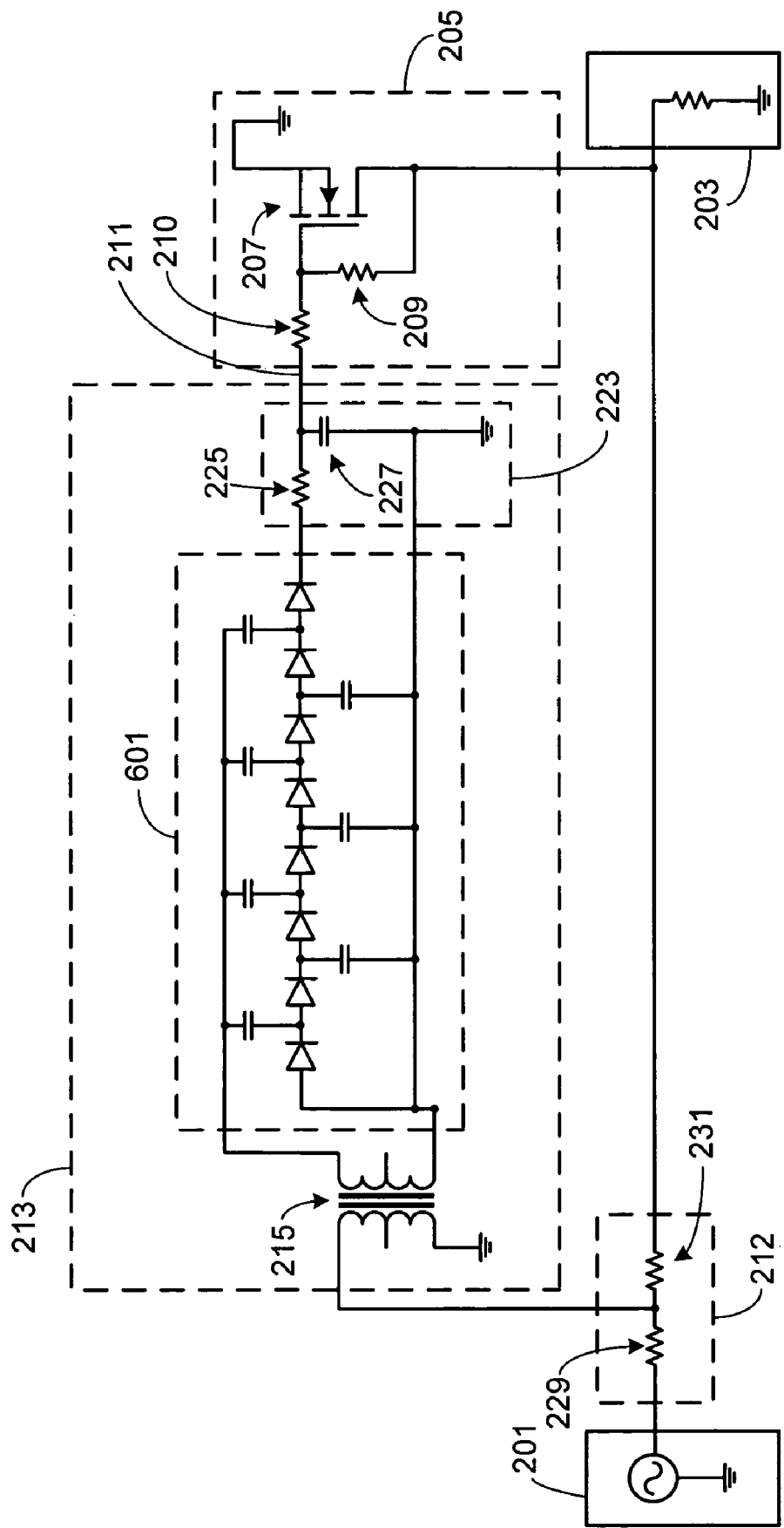
FIG. 6 illustrates an alternate embodiment utilizing a voltage multiplier.

FIG. 6 illustrates an alternate embodiment of the invention. In this embodiment, a voltage multiplier 601, acting as a rectifier, follows transformer 215. Voltage multiplier 601 is designed to convert the AC signal to a high magnitude DC signal through the use of diodes and capacitors. In the preferred embodiment, the capacitors in voltage multiplier 601 each have a value of 2200 pf. A benefit of this approach is that it allows a lower turn ratio transformer to be used while achieving the same control voltage.

In the embodiments illustrated in FIGS. 2 and 4-6, the limiting circuit relies on means, preferably a transistor, to shunt current away from the audio source, thereby limiting the SPL generated by the earpiece. In an alternate approach illustrated in FIG. 7, a series limiting circuit 701 is employed in which the voltage from audio source 201 to earpiece 203 is reduced. Preferably, the means used by series limiting circuit 701 to reduce this voltage is a transistor 703, for example a depletion-mode, n-channel MOSFET. This type of transistor has a very low channel resistance when the gate voltage is near 0 volts, with the resistance of the channel increasing as the gate to source voltage increases.

Figure 7:
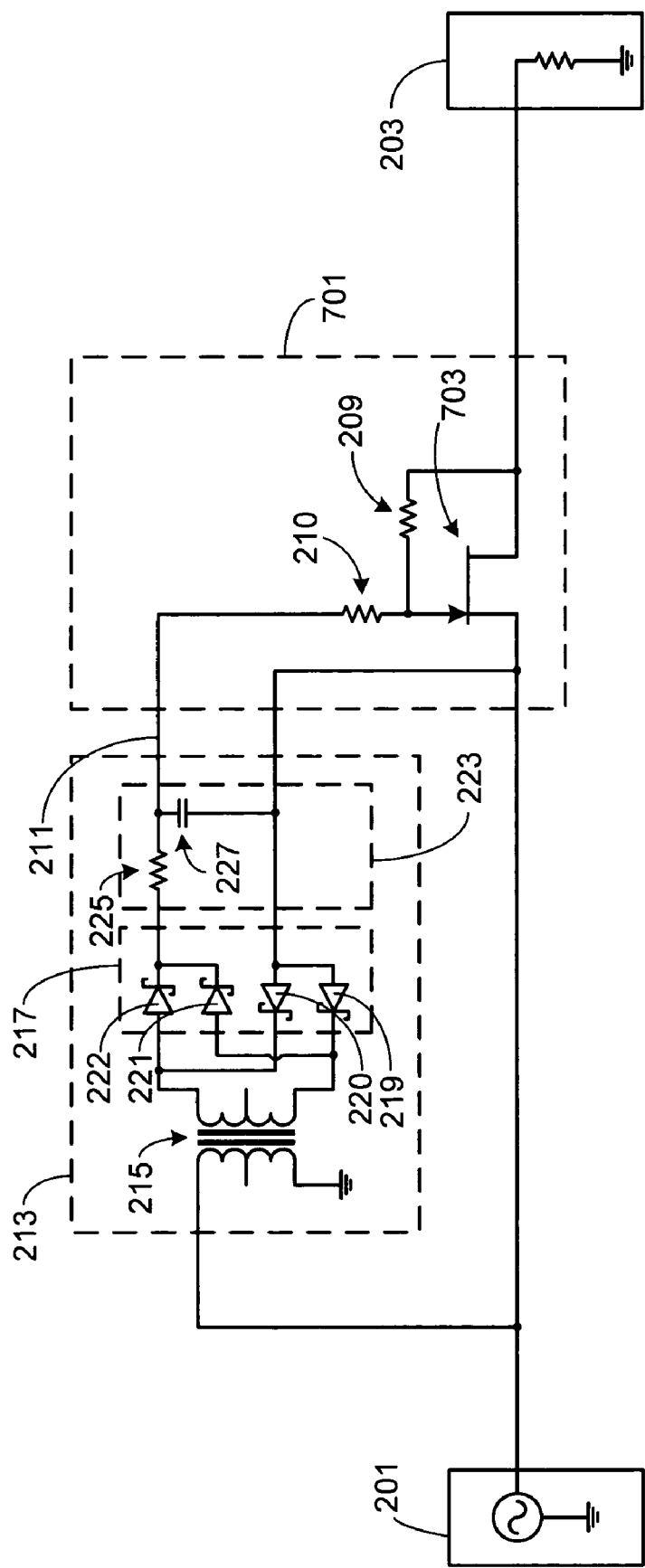
FIG. 7 illustrates an alternate embodiment utilizing a series limiting circuit.

In the embodiment illustrated in FIG. 7, as the control voltage on signal path 211 increases, the channel resistance of transistor 703 increases. This, in turn, increases the voltage drop from the drain to the source of transistor 703, thereby limiting the amount of voltage and current getting to earpiece 203. As shown, in this embodiment the pad resistors are eliminated since there is no longer a concern of shorting out audio source 201.

Although not illustrated, it will be appreciated that series limiter 701 can also be used with the other control circuits described above. Additionally, combinations of limiting circuit 205 and series limiting circuit 701 can be employed.

Figure 8:
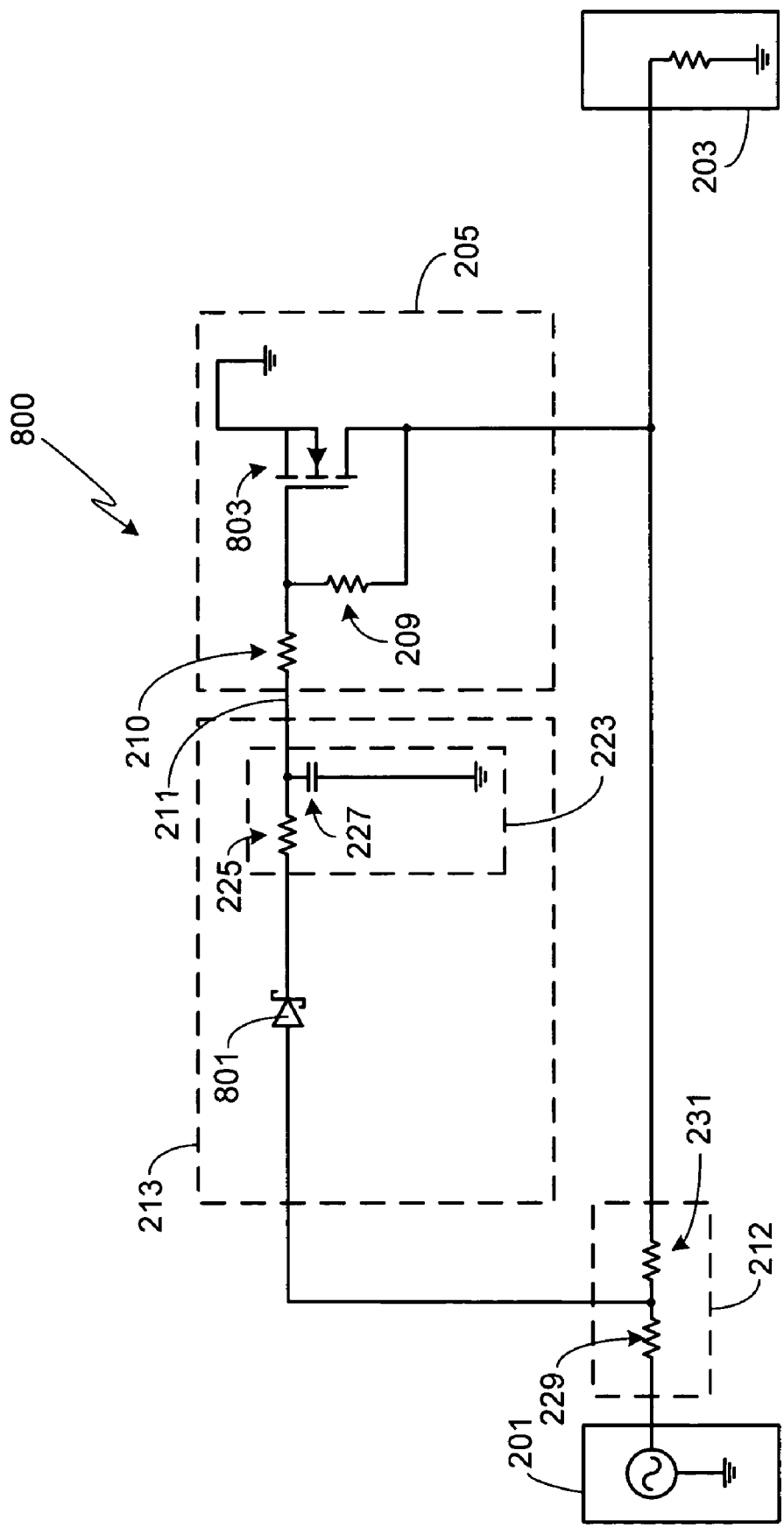
FIG. 8 illustrates an alternate embodiment suitable for use with low sensitivity earpieces.

The embodiments described above may be used with either low or high sensitivity earpieces. If, however, the limiter of the invention is to be used with a low sensitivity earpiece, then for some high output audio sources the step-up transformer can be eliminated. FIG. 8 illustrates one such embodiment. In this embodiment, diode 801 is a Schottky diode and transistor 803 is an enhancement-mode, n-channel MOSFET. Pad resistors 229 and 231 can be adjusted from 0 to a large value, depending upon the type of performance desired from limiter 800. In a minor variation of this embodiment, a voltage multiplier is used in place of diode 801.

The operation of limiter 800 is similar to the previously described, current shunting circuits. Specifically, diode 801 rectifies the positive voltage output by audio source 201. Pad resistors 229/231 limit the amount of current pulled from audio source 201. The voltage on capacitor 227 controls the amount of current that is shunted through transistor 803. As in the previous embodiments, circuit 800 includes a feedback network, i.e., resistors 209 and 210, to increase linear behavior, i.e., linearizing the current and voltage characteristics of the FET's drain to source channel for a given gate voltage.

Even though limiter 800 does not use a transformer, this circuit still achieves lower distortion than a conventional limiter by using a transistor, rather than a diode, as the limiting device. Additionally, circuit 800 uses a DC voltage to control the amount of limiting performed by the circuit.

Figure 9:
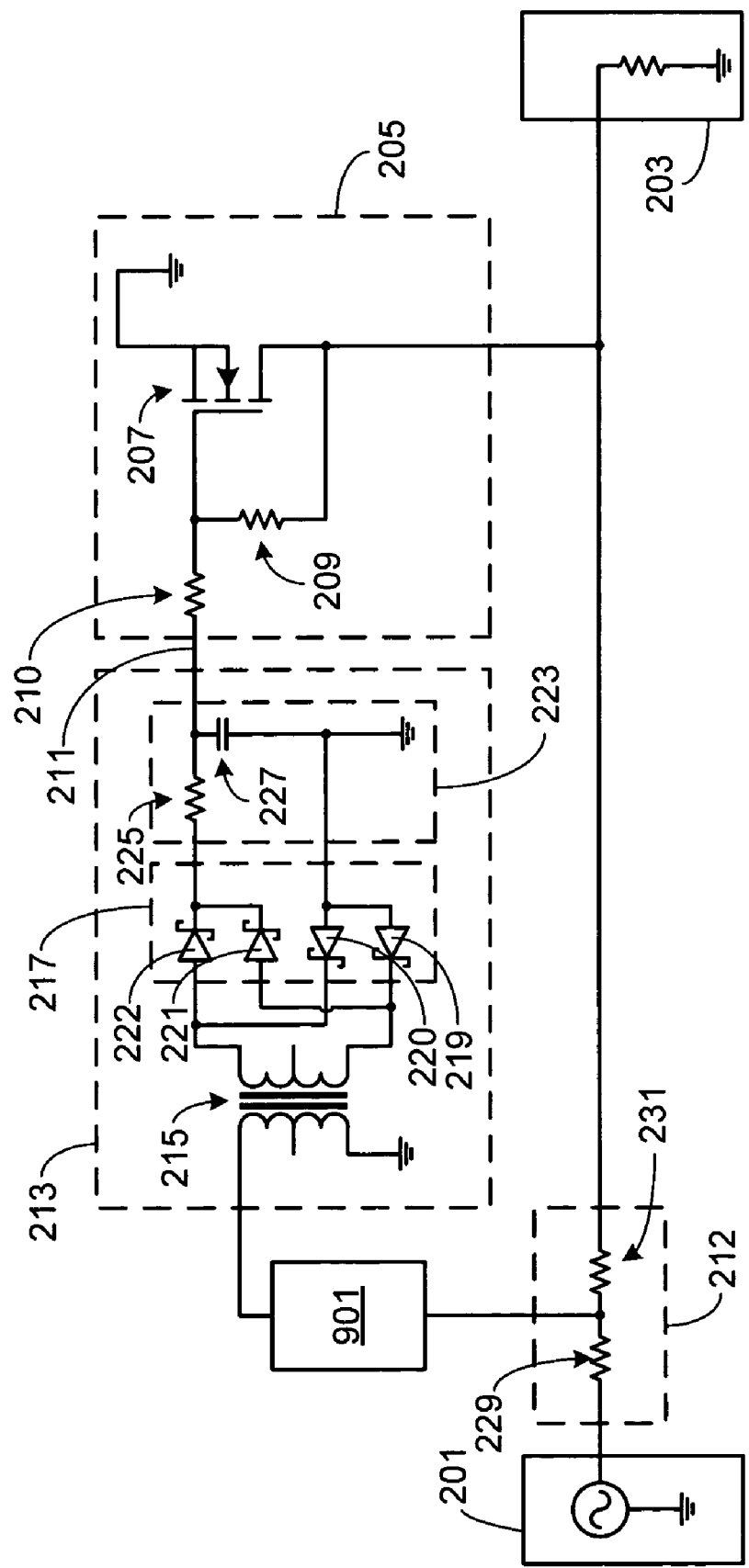
FIG. 9 illustrates a modification of the circuit shown in FIG. 2, the modified circuit including a weighting filter.

Although the principal components of a limiter in accordance with the invention have been described above, it will be appreciated that the inventors envision minor circuit variations to tailor its performance further. For example, a frequency-weighting filter may be placed in any of the previously described circuits, either between the audio source and the transformer or after the transformer. FIG. 9 shows one such embodiment, based on the configuration shown in FIG. 2, in which a frequency-weighting filter 901 is positioned before transformer 215. As it is well known that the human hearing system is more sensitive to some frequencies than others, preferably weighting filter 901 is used to take into account perceived SPL rather than actual SPL. Filter 901 may be, for example, A-, B-, C-, D- or Z-weighted. By including frequency-weighting filter 901, the output of the limiter will be based on the weighting filter, e.g., perceived loudness, rather than the actual signal voltage.

In another modification of the basic limiter circuit, a low power oscillator is used to control the limiting circuit, the oscillator circuit interposed between the control circuit and the limiting circuit. Preferably, the oscillator has a frequency above the audio bands, thus insuring that there is no audible chopping heard at earpiece 203. In the preferred embodiment, the oscillator has a frequency of 32 kHz.

Figure 10:
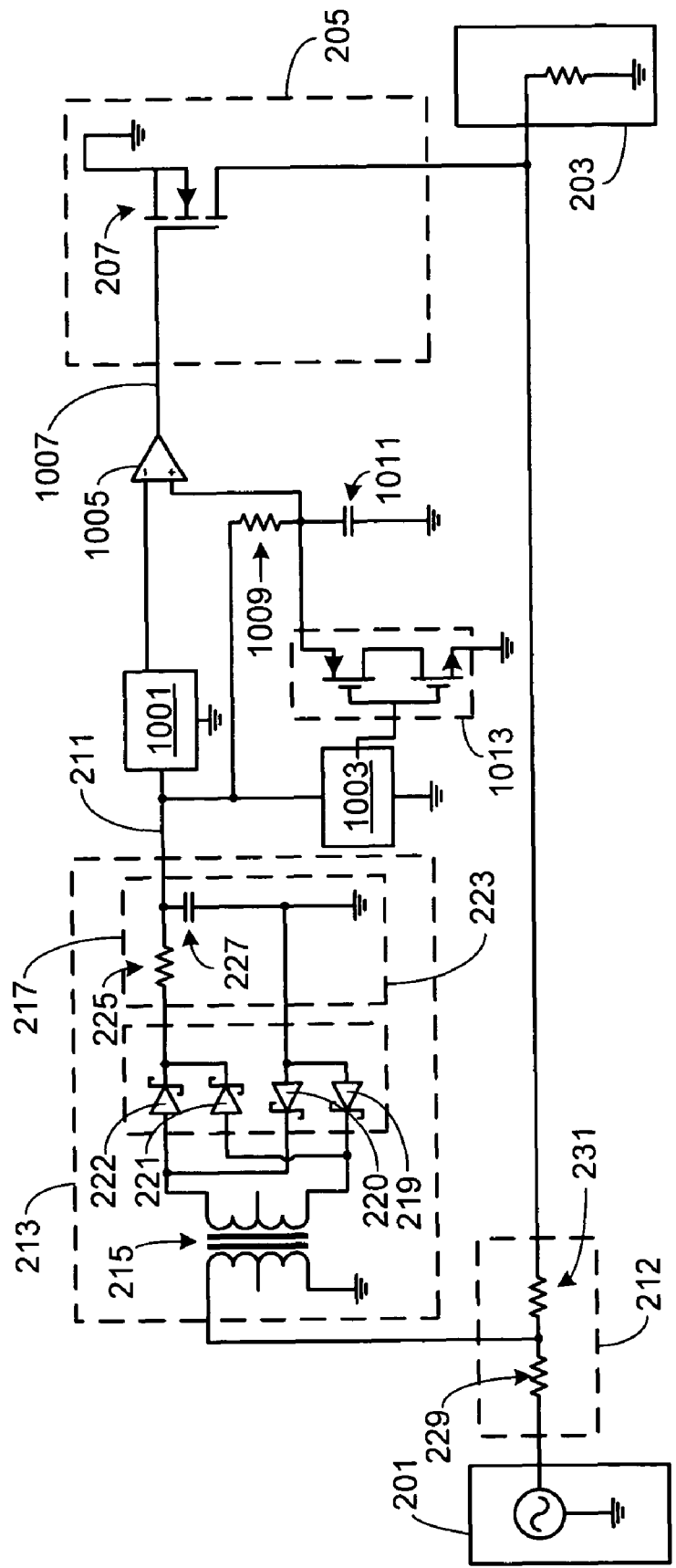
FIG. 10 illustrates a modification of the circuit shown in FIG. 2, the modified circuit including a low power oscillator.

FIG. 10 is an illustration of a preferred embodiment of the invention using an oscillator and pulse width modulation (PWM) to control the limiting circuit. Note that in this embodiment, resistors 209/210 have been eliminated from limiting circuit 205. In the previously described embodiment, resistors 209/210 acted to linearize the transfer function of the FET. In the present approach, however, the FET is either fully on or fully off, i.e., this approach is digital and nonlinear. Accordingly, resistors 209/210 are unnecessary and have therefore been eliminated from the circuit.

In the illustrated embodiment, the output from control circuit 213 is coupled to a voltage reference source 1001 and a low power oscillator 1003. Once the control voltage on signal path 211 from control circuit 213 exceeds a preset level, e.g., 2.5 volts in the illustrated embodiment, voltage reference 1001 outputs 2.5 volts to comparator 1005. Below the preset voltage level, the PWM control signal on signal path 1007 will be in a low, or off, state, thus resulting in no limiting of the signal from audio source 201.

The control voltage on signal path 211 is also coupled to resistor 1009, which allows current to flow and charge capacitor 1011. As the voltage increases, it may eventually exceed the reference voltage, e.g., 2.5 volts, at which point the PWM control signal on signal path 1007 will switch to a high, or on, state, causing FET 207 to shunt current away from earpiece 203, thereby limiting the SPL. The charge rate of capacitor 1011, and thus the duty cycle of the PWM control signal, is determined by the voltage on signal path 211, i.e., the higher the voltage, the faster the charge rate and the more time that current is shunted away from the earpiece, thereby reducing SPL. Note that when oscillator 1003 switches state, i.e., from high to low or low to high, CMOS pair 1013 allows current to flow to ground, thereby resetting the charging curve.

Figure 11:
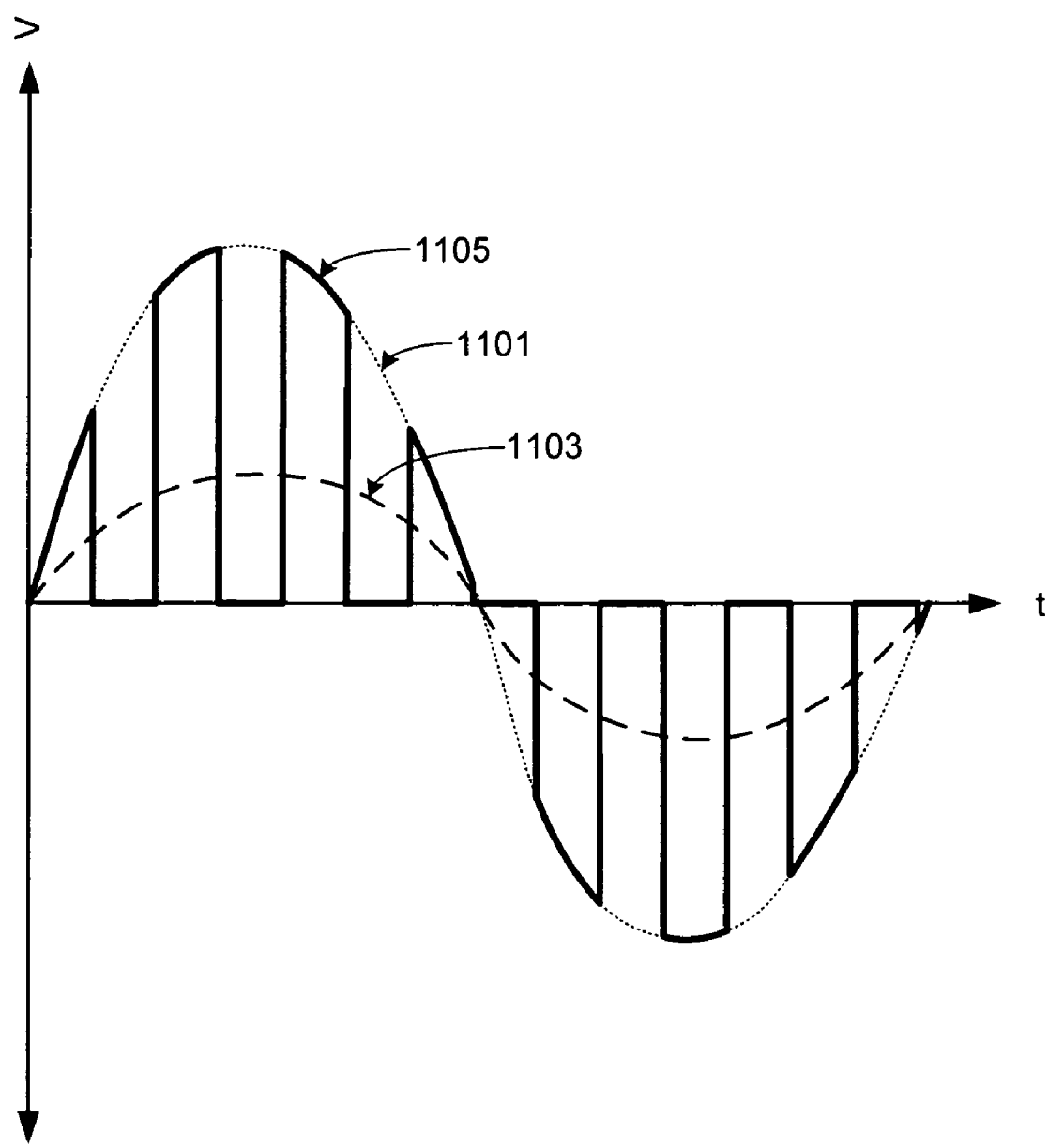
FIG. 11 graphically illustrates the performance of a PWM limiter, as described relative to FIG. 10, compared to an analog limiter, as described relative to FIGS. 2-9.

FIG. 11 graphically illustrates the performance of a PWM limiter, as described above relative to FIG. 10, compared to that of an analog limiter, as described above relative to FIGS. 2 and 4-9. In this figure, earpiece drive voltage is graphed versus time. Curve 1101 represents the earpiece drive voltage unaffected by a limiting circuit. Curve 1103 represents the limited drive voltage using an analog limiting circuit. Curve 1105 represents the limited drive voltage using a PWM digital limiting circuit. Although the PWM voltage has higher amplitudes, the average signal energy for the digital and analog limiting circuits is approximately equal.

Figure 12:
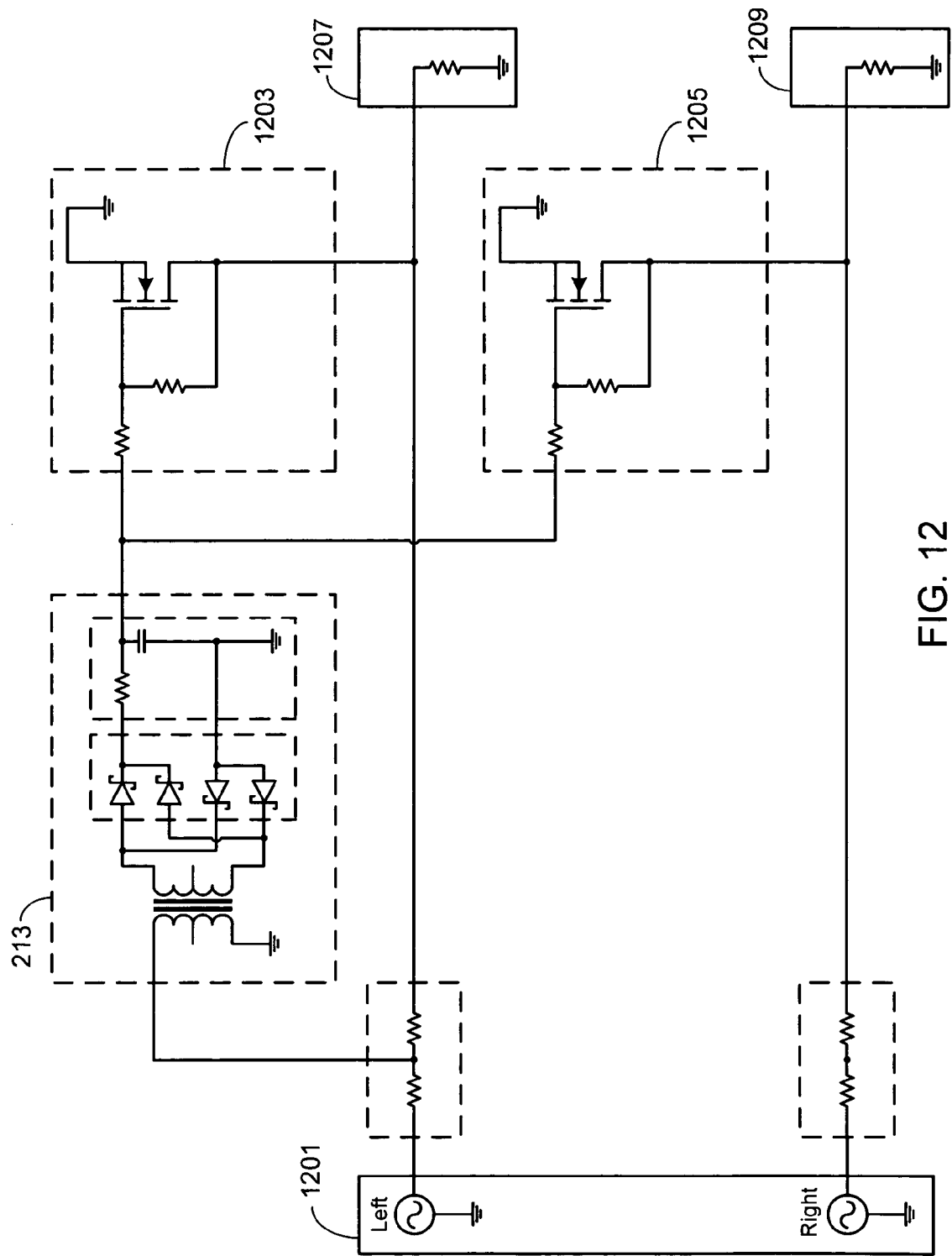
FIG. 12 illustrates a dual channel configuration utilizing a single transformer and control circuit.
Figure 13:
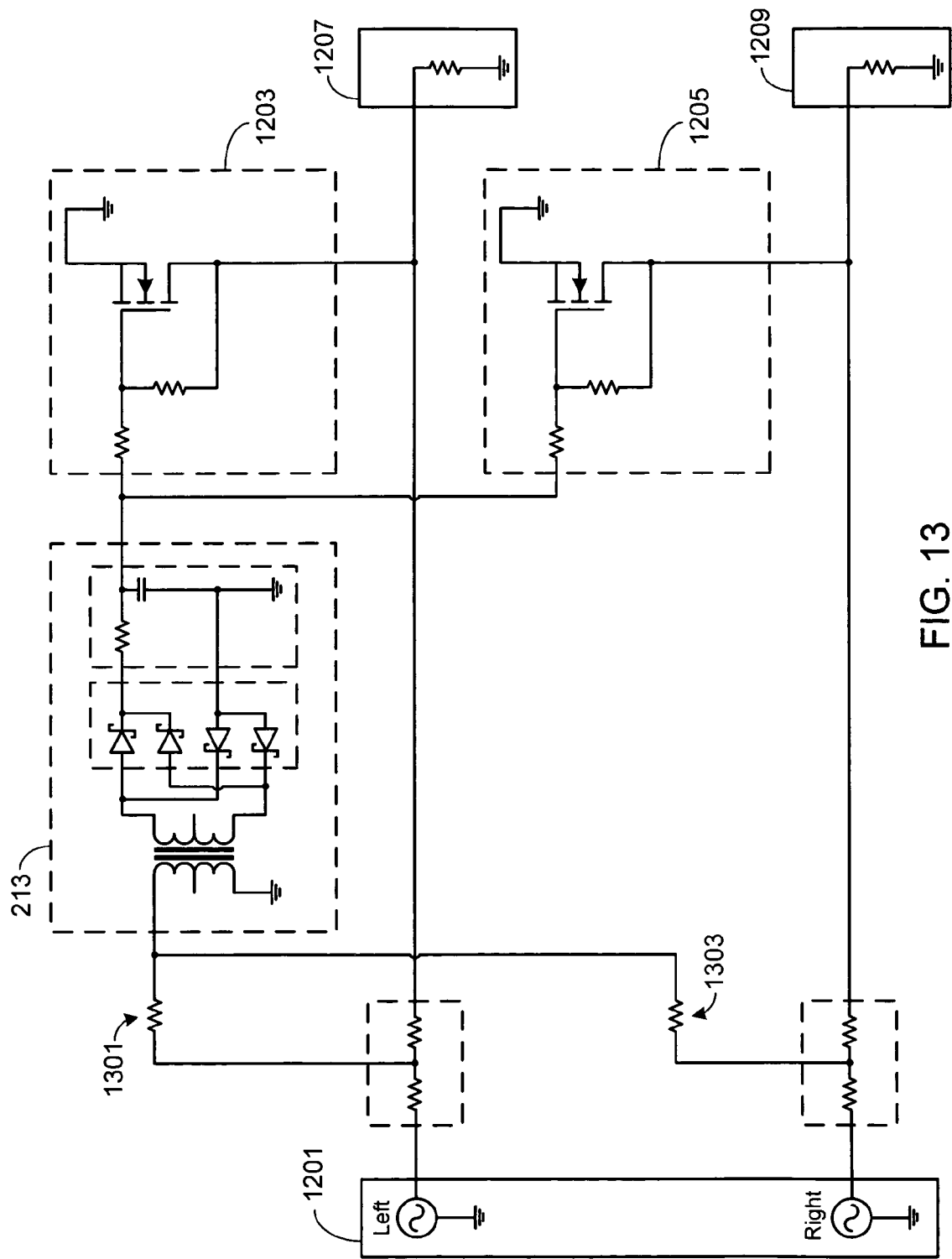
FIG. 13 illustrates an alternate dual channel configuration in which multiple channels are coupled to a single transformer and control circuit.

As previously noted, the inventors envision that an SPL limiter in accordance with the invention would typically be used in a multi-channel application, e.g., a stereo application. In addition to simply duplicating one of the previously described circuits and using one circuit per channel, other configurations are possible which would allow the SPL limiter of the present invention to be used for a multi-channel application. For example, in the embodiment shown in FIG. 12, based on the circuit of FIG. 2, control circuit 213 is coupled to a single audio source channel, e.g., the left channel of audio source 1201 in the illustrated embodiment. The output from control circuit 213 is then used to control both the left and right channel limiting circuits 1203 and 1205, respectively, and the left and right channel earpieces 1207 and 1209, respectively. In an alternate configuration illustrated in FIG. 13, control circuit 213 is coupled to the output from both audio source channels, thus averaging the output from both channels. In this embodiment, to insure channel separation and maintain audio quality, resistors 1301 and 1303 are interposed between control circuit 213 and the left and right channels, respectively. As in the prior embodiment, the output from control circuit 213 is used to control both the left and right channel limiting circuits. It will be understood that any of the previously described single channel embodiments could also be used for a multi-channel application and that the configurations based on the circuit of FIG. 2 are only meant to illustrate, not limit, the multi-channel approach.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention.

What is claimed is:

1. A passive sound pressure level (SPL) limiter coupled to an earpiece and an audio source, wherein the passive SPL limiter limits an audio signal from the audio source to the earpiece, the passive SPL limiter comprising:
   a control circuit electrically connected to the audio source and receiving an output signal from the audio source, said control circuit comprising a rectifier circuit, wherein said control circuit outputs a control signal via a control circuit output; and
   a limiting circuit electrically connected to said control circuit output, said limiting circuit receiving said control signal from said control circuit via said control circuit output, said limiting circuit comprising a transistor, and wherein said limiting circuit reduces power from the audio source to the earpiece in proportion to said control signal in order to limit the audio signal from the audio source to the earpiece, and wherein said transistor limits voltage from the audio source to the earpiece in proportion to said control signal.

2. A passive sound pressure level (SPL) limiter coupled to an earpiece and an audio source, wherein the passive SPL limiter limits an audio signal from the audio source to the earpiece, the passive SPL limiter comprising:
   a control circuit electrically connected to the audio source and receiving an output signal from the audio source, said control circuit comprising a rectifier circuit, wherein said control circuit outputs a control signal via a control circuit output; and
   a limiting circuit electrically connected to said control circuit output, said limiting circuit receiving said control signal from said control circuit via said control circuit output, said limiting circuit comprising a transistor, and wherein said limiting circuit reduces power from the audio source to the earpiece in proportion to said control signal in order to limit the audio signal from the audio source to the earpiece, and wherein said transistor shunts current from the audio source in proportion to said control signal.

3. The passive SPL limiter of claim 2, wherein said transistor is an enhancement-mode, n-channel MOSFET.

4. The passive SPL limiter of claim 1, wherein said transistor is a depletion-mode, n-channel MOSFET.

5. A passive sound pressure level (SPL) limiter coupled to an earpiece and an audio source, wherein the passive SPL limiter limits an audio signal from the audio source to the earpiece, the passive SPL limiter comprising:
   a control circuit electrically connected to the audio source and receiving an output signal from the audio source, said control circuit comprising a rectifier circuit, wherein said control circuit outputs a control signal via a control circuit output, said control circuit further comprising a transformer, said transformer increasing the voltage corresponding to the output signal from the audio source, wherein said rectifier is located on a secondary side of said transformer, and wherein said transformer has a turns ratio of between 1:10 and 1:50; and
   a limiting circuit electrically connected to said control circuit output, said limiting circuit receiving said control signal from said control circuit via said control circuit output, said limiting circuit comprising a transistor, and wherein said limiting circuit reduces power from the audio source to the earpiece in proportion to said control signal in order to limit the audio signal from the audio source to the earpiece.

6. The passive SPL limiter of claim 1, wherein said rectifier circuit is a full wave rectifier comprised of four Schottky diodes.

7. A passive sound pressure level (SPL) limiter coupled to an earpiece and an audio source, wherein the passive SPL limiter limits an audio signal from the audio source to the earpiece, the passive SPL limiter comprising:
   a control circuit electrically connected to the audio source and receiving an output signal from the audio source, said control circuit comprising a rectifier circuit, wherein said control circuit outputs a control signal via a control circuit output, said control circuit further comprising a filter circuit interposed between said rectifier circuit and said control circuit output, wherein said filter circuit is a low pass filter comprised of an RC filter; and
   a limiting circuit electrically connected to said control circuit output, said limiting circuit receiving said control signal from said control circuit via said control circuit output, said limiting circuit comprising a transistor, and wherein said limiting circuit reduces power from the audio source to the earpiece in proportion to said control signal in order to limit the audio signal from the audio source to the earpiece.

8. The passive SPL limiter of claim 7, said control circuit further comprising a fast limit diode path in parallel with a resistor of said RC filter, wherein said fast limit diode path is comprised of at least one diode.

9. The passive SPL limiter of claim 8, said fast limit diode path further comprising a current limiting resistor in series with said at least one diode.

10. The passive SPL limiter of claim 7, said control circuit further comprising at least a first fast limit diode path with a first charge rate and a second fast limit diode path with a second charge rate, wherein said at least first and second fast limit diode paths are in parallel with a resistor of said RC filter.

11. The passive SPL limiter of claim 10, wherein at least one of said first and second fast limit diode paths are further comprised of a current limiting resistor.

12. A passive sound pressure level (SPL) limiter coupled to an earpiece and an audio source, wherein the passive SPL limiter limits an audio signal from the audio source to the earpiece, the passive SPL limiter comprising:
   a control circuit electrically connected to the audio source and receiving an output signal from the audio source, said control circuit comprising a rectifier circuit, wherein said control circuit outputs a control signal via a control circuit output; and
   a limiting circuit electrically connected to said control circuit output, said limiting circuit receiving said control signal from said control circuit via said control circuit output, said limiting circuit comprising a transistor, and wherein said limiting circuit reduces power from the audio source to the earpiece in proportion to said control signal in order to limit the audio signal from the audio source to the earpiece, said limiting circuit further comprising a feedback network, said feedback network comprised of at least a pair of resistors.

13. The passive SPL limiter of claim 12, wherein said feedback network increases linear behavior of said limiting circuit.

14. A passive sound pressure level (SPL) limiter coupled to an earpiece and an audio source, wherein the passive SPL limiter limits an audio signal from the audio source to the earpiece, the passive SPL limiter comprising:
   a control circuit electrically connected to the audio source and receiving an output signal from the audio source, said control circuit comprising a rectifier circuit, wherein said control circuit outputs a control signal via a control circuit output;
a limiting circuit electrically connected to said control circuit output, said limiting circuit receiving said control signal from said control circuit via said control circuit output, said limiting circuit comprising a transistor, and wherein said limiting circuit reduces power from the audio source to the earpiece in proportion to said control signal in order to limit the audio signal from the audio source to the earpiece; and
a pair of pad resistors interposed between said audio source and said earpiece.

15. A passive sound pressure level (SPL) limiter coupled to an earpiece and an audio source, wherein the passive SPL limiter limits an audio signal from the audio source to the earpiece, the passive SPL limiter comprising:
a control circuit electrically connected to the audio source and receiving an output signal from the audio source, said control circuit comprising a rectifier circuit, wherein said control circuit outputs a control signal via a control circuit output, and wherein said rectifier circuit is comprised of a voltage multiplier; and
a limiting circuit electrically connected to said control circuit output, said limiting circuit receiving said control signal from said control circuit via said control circuit output, said limiting circuit comprising a transistor, and wherein said limiting circuit reduces power from the audio source to the earpiece in proportion to said control signal in order to limit the audio signal from the audio source to the earpiece.

16. A passive sound pressure level (SPL) limiter coupled to an earpiece and an audio source, wherein the passive SPL limiter limits an audio signal from the audio source to the earpiece, the passive SPL limiter comprising:
a control circuit electrically connected to the audio source and receiving an output signal from the audio source, said control circuit comprising a rectifier circuit, wherein said control circuit outputs a control signal via a control circuit output;
a limiting circuit electrically connected to said control circuit output, said limiting circuit receiving said control signal from said control circuit via said control circuit output, said limiting circuit comprising a transistor, and wherein said limiting circuit reduces power from the audio source to the earpiece in proportion to said control signal in order to limit the audio signal from the audio source to the earpiece; and
a frequency-weighting filter.

17. The passive SPL limiter of claim 16, wherein said frequency-weighting filter is interposed between said audio source and said control circuit.

18. A passive sound pressure level (SPL) limiter coupled to an earpiece and an audio source, wherein the passive SPL limiter limits an audio signal from the audio source to the earpiece, the passive SPL limiter comprising:
a control circuit electrically connected to the audio source and receiving an output signal from the audio source, said control circuit comprising a rectifier circuit, wherein said control circuit outputs a control signal via a control circuit output;
a limiting circuit electrically connected to said control circuit output, said limiting circuit receiving said control signal from said control circuit via said control circuit output, said limiting circuit comprising a transistor, and wherein said limiting circuit reduces power from the audio source to the earpiece in proportion to said control signal in order to limit the audio signal from the audio source to the earpiece;
an oscillator circuit interposed between said control circuit and said limiting circuit, said oscillator circuit comprising:
a voltage reference source with an input electrically connected to said control circuit output, wherein said voltage reference source outputs a regulated reference voltage;
a charging capacitor electrically connected to said control circuit output through a resistor;
a comparator electrically connected to an output of said voltage reference source and to said charging capacitor, wherein said comparator outputs a first signal to said limiting circuit when an output from said charging capacitor is greater than said reference voltage and outputs a second signal to said limiting circuit when said output from said charging capacitor is less than said reference voltage;
means to discharge said charging capacitor to ground; and
an oscillator electrically connected to said output of said control circuit, wherein during a state change said oscillator causes said means to discharge said charging capacitor to ground.

19. The passive SPL limiter of claim 18, wherein said means to discharge said charging capacitor to ground is comprised of a CMOS pair.

20. A passive sound pressure level (SPL) limiter coupled to an earpiece and an audio source, wherein the passive SPL limiter limits an audio signal from the audio source to the earpiece, the passive SPL limiter comprising:
a control circuit electrically connected to the audio source and receiving an output signal from the audio source, said control circuit comprising a rectifier circuit, wherein said control circuit outputs a control signal via a control circuit output;
a limiting circuit electrically connected to said control circuit output, said limiting circuit receiving said control signal from said control circuit via said control circuit output, said limiting circuit comprising a transistor, and wherein said limiting circuit reduces power from the audio source to the earpiece in proportion to said control signal in order to limit the audio signal from the audio source to the earpiece; and
a second limiting circuit electrically connected to said control circuit output and receiving said control signal from said control circuit, wherein said second limiting circuit shunts current from said audio source in proportion to said control signal in order to limit the audio signal from a second channel of the audio source to a second earpiece.

21. The passive SPL limiter of claim 20, wherein said control circuit receives a second output signal from the audio source, said second output signal corresponding to said second channel of the audio source.

22. The passive SPL limiter of claim 2, wherein said rectifier circuit is a full wave rectifier comprised of four Schottky diodes.

23. The passive SPL limiter of claim 5, wherein said rectifier circuit is a full wave rectifier comprised of four Schottky diodes.

24. The passive SPL limiter of claim 7, wherein said rectifier circuit is a full wave rectifier comprised of four Schottky diodes.

* * * * *